(12) United States Patent
Pihlaja

(10) Patent No.: US 6,891,831 B1
(45) Date of Patent: May 10, 2005

(54) DATA TRANSMISSION METHOD

(75) Inventor: Juha Pihlaja, Espoo (FI)

(73) Assignee: Nokia Corporation, Espoo (FI)

( * ) Notice: Subject to any disclaimer, the term of this patent is extended or adjusted under 35 U.S.C. 154(b) by 124 days.

(21) Appl. No.: 10/089,899

(22) PCT Filed: Oct. 5, 2000

(86) PCT No.: PCT/FI00/00860

§ 371 (c)(1),
(2), (4) Date: May 8, 2002

(87) PCT Pub. No.: WO01/26254

PCT Pub. Date: Apr. 12, 2001

(30) Foreign Application Priority Data

Oct. 5, 1999 (FI) ............................................ 19992148

(51) Int. Cl.[7] ............................................. H04L 12/28
(52) U.S. Cl. ................. 370/394; 370/395.64; 370/412; 370/442; 370/470; 370/471; 370/474; 370/477; 714/746; 714/763; 714/769
(58) Field of Search ........................... 370/394, 395.64, 370/412, 442, 470, 471, 474, 477; 714/746, 763, 769

(56) References Cited

U.S. PATENT DOCUMENTS

| 4,555,774 | A | | 11/1985 | Bernstein ..................... 364/900 |
|---|---|---|---|---|
| 5,323,395 | A | | 6/1994 | Henrion ........................ 370/94 |
| 5,333,135 | A | | 7/1994 | Wendorf ..................... 370/94.1 |
| 6,345,056 | B1 | * | 2/2002 | Bharucha et al. ........... 370/474 |
| 6,463,040 | B1 | * | 10/2002 | Dutta .......................... 370/280 |
| 6,600,746 | B1 | * | 7/2003 | Petersen ..................... 370/394 |
| 6,654,374 | B1 | * | 11/2003 | Fawaz et al. ............... 370/394 |

FOREIGN PATENT DOCUMENTS

| EP | 0 557 130 A2 | 2/1993 | .......... G11B/20/14 |
|---|---|---|---|
| EP | 0 786 919 A1 | 7/1997 | .......... H04Q/11/04 |
| EP | 0 844 566 A1 | 5/1998 | .......... G06F/13/28 |
| EP | 0 866 589 A1 | 9/1998 | .......... H04L/29/02 |
| EP | 0 935 363 A1 | 8/1999 | ............. H04L/1/00 |
| EP | 1 022 927 A2 | 7/2000 | .......... H04Q/11/04 |
| GB | 2 338 382 A | 12/1999 | .......... H04L/29/06 |
| JP | 61-174845 | 8/1986 | ............. H04L/5/16 |

\* cited by examiner

*Primary Examiner*—Dang Ton
*Assistant Examiner*—Inder Pal Mehra
(74) *Attorney, Agent, or Firm*—Cohen, Pontani, Lieberman & Pavane

(57) ABSTRACT

The invention is related to coding and decoding data, more particularly in microwave radio link systems. According to the invention, the sequence of data to be encoded at a transmitting end is split into at least two blocks, if the sequence is longer than a first predetermined length M. The splitting is performed so that the length first block is equal to the first predetermined length M. If the remaining sequence is shorter than a second predetermined length N, the second block comprises all of the remaining sequence. If the remaining sequence is longer than the second predetermined length N, the length of the second block is found by subtracting from the length of the remaining sequence the highest integer multiple of the second predetermined length, and the rest of the sequence is split into blocks of length N. If the sequence is shorter than the first predetermined length M, only one block is produced, and the sequence is padded with dummy values to form a sequence of length M. If the sequence is exactly M units long, the first and in that case the only block comprises the whole sequence. The blocks are then separately encoded with the desired coding function.

32 Claims, 4 Drawing Sheets

DATA TRANSMISSION METHOD

PRIORITY CLAIM

This is a national stage application under 35 U.S.C. §371 of international stage PCT application No. PCT/FI00/00860, filed on Oct. 5, 2000. Priority is claimed under 35 U.S.C. §119(a) and 35 U.S.C. §365(b) from Finnish Patent Application No. 19992148, which was filed in Finland on Oct. 5, 1999, and from which priority was properly claimed in the aforementioned international stage application.

BACKGROUND OF THE INVENTION

1. Field of the Invention

The invention is related to coding and decoding data, more particularly in microwave link systems.

2. Description of Related Art

The problems of prior art can be illustrated with reference to point-to-multipoint (PMP) radio systems, in which the access points (AP) operate in full-duplex mode and terminals (Access Terminal, AT) operate in half-duplex mode. FIG. 1 illustrates the structure of such a system. FIG. 1 shows terminals 10, an access point 20, and a telecommunications network 30. Typically such systems are used to provide fixed wireless connections between a central station i.e. an access point 20 (AP) and several fixed substations i.e. access terminals 10 (AT). Such systems are very advantageous in environments, where provision of fixed lines would cause prohibitive costs, such as in cities. Typically such systems are used to link base stations of a cellular telecommunications network to a central station 20, which is connected to rest of the telecommunications network 30. Such systems are also; often used for providing wireless local area networks (WLAN). Such systems are also often used to provide connections between public networks and private business and residential customers.

In many cases such systems use time division to separate signals of the terminals from each other, i.e. they are arranged to transmit at different times. For simplicity and reasons of cost, terminals typically operate in half-duplex mode, i.e. the terminals cannot transmit and receive at the same time. The access points are typically capable of full-duplex operation. The number of access points in a network is considerably lower than the number of terminals, whereby the requirements for low cost are not as stringent as in the case of terminals and the structure of access points can be more complicated.

One example of such a system is the HIPERACCESS and HIPERLAN systems specified by the European Telecommunications Standards Institute. The HIPERACCESS system is described in detail in the ETSI specification DTR/BRAN-010001 "Broadband Radio Access Networks (BRAN): Requirements and architectures for HIPERACCESS fixed networks".

Such systems need error correction mechanisms in order to ensure that the transmitted data is correct. One typically used error correction method is Reed-Solomon coding, which is especially well suitable for correcting error bursts, i.e. errors in which a number of consecutive bits are in error. In the Reed-Solomon method, a certain number of parity symbols are calculated from the data to be transmitted and appended to the data. The data and the appended parity symbols are transmitted to a receiver, which can detect and correct errors on the basis of the information in parity symbols. However, the Reed-Solomon method has the drawback, that the receiver needs to know the number of symbols in a transmission block, i.e. the number of payload data and the number of parity symbols calculated from the payload data. This is problematic in cases, when the length of transmitted messages vary. One straightforward solution is to use a constant transmission block size which is specified to be large enough, that any possible transmitted message will fit in the block. If the message to be transmitted does not fill the whole block, the rest of the block is padded with dummy values for transmission, which dummy values are removed by the receiver from the received data. This solution has the drawback, that it creates an excessive overhead for the transmission of short messages.

These problems are typically found in transmission of broadcast messages in PMP radio link systems, in which messages the access point sends announcements and control information to the terminals. Better solutions are clearly needed.

SUMMARY OF THE INVENTION

An object of the invention is to realize a transmission method, which requires only very little overhead. A further object of the invention is to realize a transmission method, which allows the transmission of variable length messages without excessive overhead.

The objects are reached by transmitting a message in pieces whose lengths are determined using a previously agreed set of rules, encoding the first piece in a previously agreed way, and indicating the total length of the message in the first piece. The receiver can then receive and decode the first piece, and from the information contained in the first piece, the receiver can determine the lengths and coding methods of the other pieces.

According to the invention, the sequence of data to be encoded at a transmitting end is split into at least two blocks, if the sequence is longer than a first predetermined length M. The splitting is performed so that the length of the data portion in the first block is equal to the first predetermined length M. If the remaining sequence is shorter than a second predetermined length N, the second block comprises all of the remaining sequence. If the remaining sequence is longer than the second predetermined length N, the length S of the data portion in the second block is found by subtracting from the length of the remaining sequence the highest integer multiple of the second predetermined length, and the rest of the sequence is split into blocks of length N. If the sequence is shorter than the first predetermined length M, only one block is produced, and the sequence is padded with dummy values to form a sequence of length M. If the sequence is exactly M units long, the first and in that case the only block comprises the whole sequence. The blocks are then separately encoded with the desired coding function.

In this description, an indication of the length of the data sequence to be coded is assumed to be present in the beginning of the sequence, for example as a predetermined number of bytes indicating the total length of the sequence including the length indication. Such a sequence can naturally be produced from any data sequence to be transmitted by calculating the length of the sequence, adding to the length the length of the length indication, and prepending the result to the sequence. The indication of the total length is in the first block, which allows the decoding of the coded blocks by the receiver. Since the first block is of a predetermined size, it can be decoded directly. The total length of the data sequence is determined from the contents of the first block, and by reversing the calculation used to determine the amount and lengths of the rest of the blocks in the transmitting end, the receiver can determine the lengths of the following blocks, and therefore is able to correctly receive and decode them.

The unit of length i.e. the size of a data symbol may be different in different embodiments of the invention. Advantageously, the data symbol comprises 8 bits i.e. one byte, and the length of the data sequence is counted in bytes. For most practical purposes at least for PMP microwave radio link use, the sequence length indication can be realized using two bytes, which allows a sequence to be 65535 bytes long. However, the invention is not limited to the length being specified by exactly two bytes, since the length of the indication is merely a result of practical considerations pertinent to the particular application of the invention.

In one advantageous embodiment, the coding method used is Reed-Solomon coding, which is quite widely used in telecommunications. However, the invention is not limited only to Reed-Solomon coding, since other coding methods can be used as well in various embodiments of the invention.

BRIEF DESCRIPTION OF THE DRAWINGS

The invention is described in more detail in the following with reference to the accompanying drawings, of which

DETAILED DESCRIPTION OF THE PREFERRED EMBODIMENTS

Figure 1:
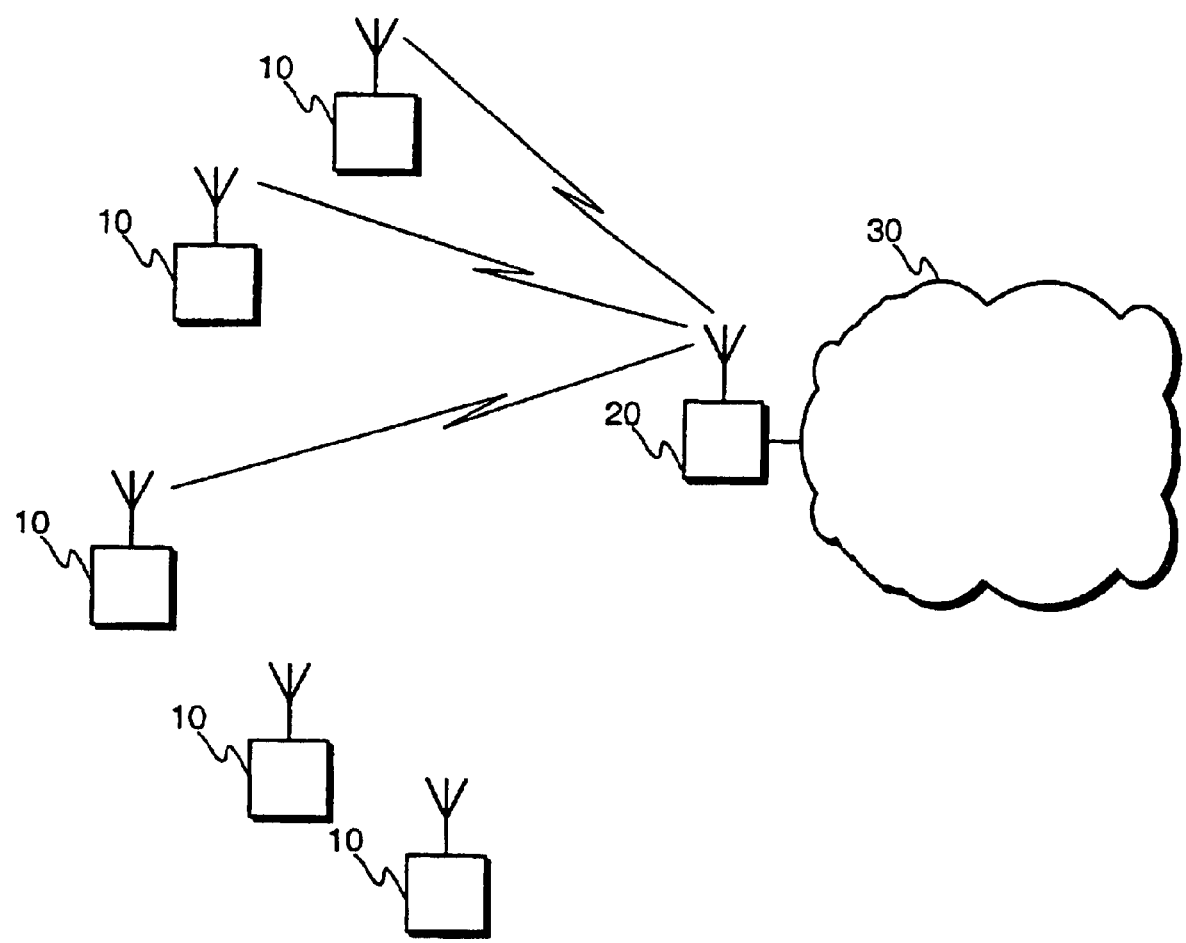
FIG. 1 illustrates a PMP system according to prior art.

A. A First Group of Advantageous Embodiments of the Invention

In the following, a method according to an advantageous embodiment is described with reference to FIG. 2. The figure illustrates processing of data at the transmitting end.

In the beginning, it is checked 100 if the length of the data sequence to be transmitted is smaller than the predefined limit M. If it is, padding symbols are added 105 to the sequence to make the length to be exactly M, and the resulting data block is encoded 110 and transmitted 115. If the length of the data sequence is not smaller than M, it is checked 120 if the length equals M. If it does, the sequence is encoded 110 and transmitted 115.

The predefined limit M may advantageously be for example 8, which allows the transmission of very short messages in one transmission block without significant overhead. Naturally, other values may be used for M, which for optimal use of radio resources should advantageously be not much larger than the length of some frequently repeating short messages in order to avoid overhead.

If the length of the data sequence was not found to be equal to M in step 120, the sequence is longer than M, and, therefore, more than one transmission block will be needed. For this end, the length S of the second block is calculated in step 125 and the number F of further blocks is calculated in step 130.

The number F of further blocks is simply the integer part of the result of division of the remaining length of the data sequence after subtraction of M by the predetermined length N of the further blocks, i.e.

$$F = INT((LENGTH-M)/N) \quad (1)$$

where LENGTH is the length of the data sequence to be transmitted, and INT is a function returning the integer part of its argument. The length S can be calculated simply by $$S = (LENGTH-M) \bmod N \quad (2)$$

where a MOD b is the modulo function returning the remainder of an integer division of a/b.

Next, the first transmission block is prepared 135 by picking from the original data sequence the first M symbols and encoding them, after which the encoded block is transmitted 140. After this, the second transmission block is prepared 145 by picking from the original data sequence the following S symbols and encoding them, after which the encoded block is transmitted 150.

In the next step, it is checked 155 if the value of F is greater than zero. If it is not, no more blocks need to be sent and the method is ended. If the value is greater than zero, the next transmission block is prepared 160 by picking from the original data sequence the following N symbols and encoding them, after which the encoded block is transmitted 165. The value of F is decremented 170 by one, after which the method is continued again from step 155.

Figure 2:
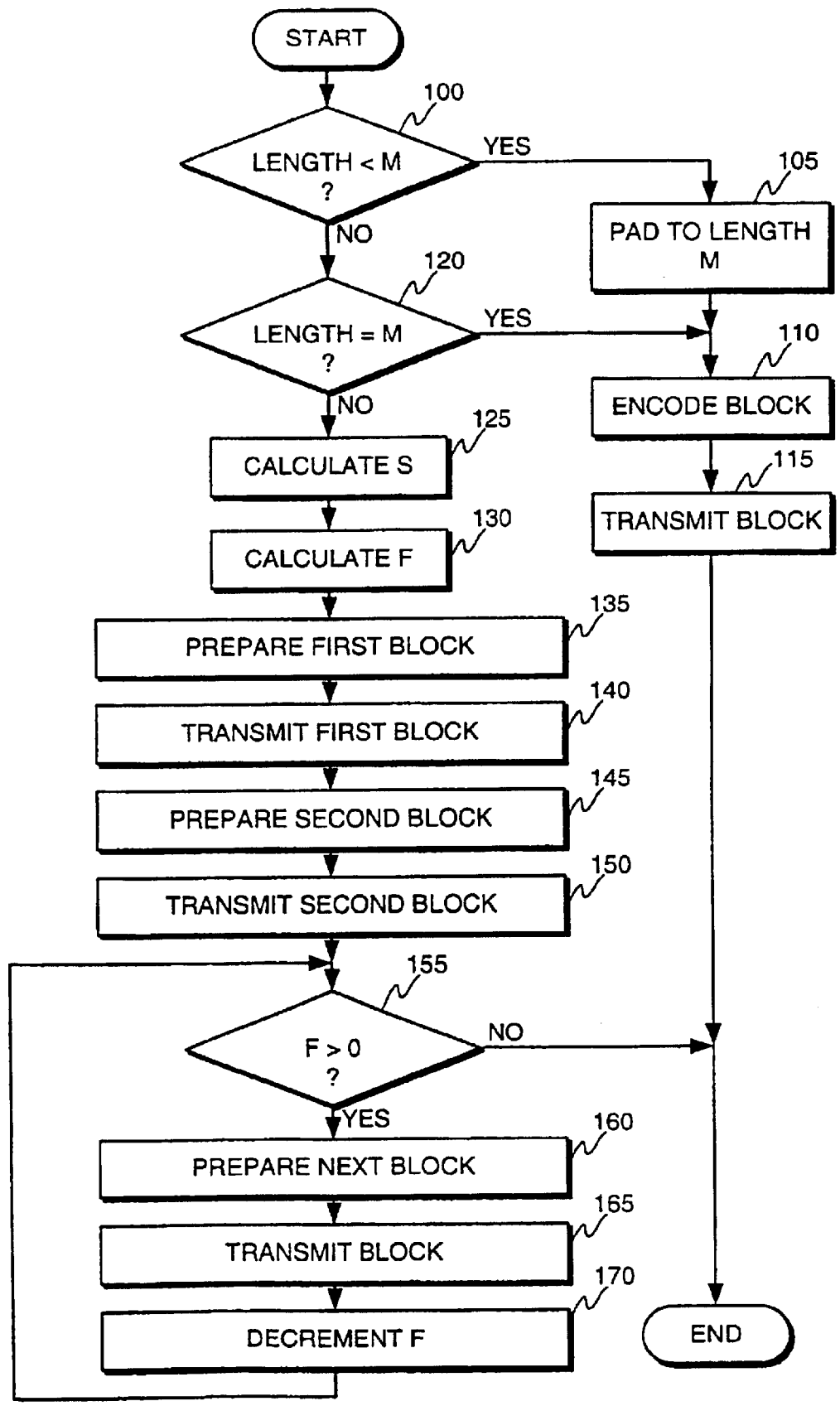
FIG. 2 illustrates a method according to an advantageous embodiment of the invention.

FIG. 2 is only an example of an advantageous embodiment of the invention, and the invention is not limited to only the method shown in FIG. 2. For example, the steps of transmitting blocks 115, 140, 150, 165 can as well be performed after all other steps, if the encoded blocks are temporarily stored in a memory unit for the duration of the preparation of other transmission blocks.

The value of N can advantageously be for example 128, which is suitable for Reed-Solomon coding of symbols comprising 8 bits.

The receiver needs to know the values M and N, and the coding method used in order to decode the received transmission blocks. From the knowledge of M and the coding method, the receiver knows how many symbols belong to the first transmission block, and is therefore able to receive and decode the first transmission block. The receiver can then read the length indication, and determine if a second transmission block will be received and its length, as well as the number of any possible further transmission blocks.

B. A Second Group of Advantageous Embodiments of the Invention

In an advantageous embodiment of the invention, Reed-Solomon coding is used for coding of the blocks for transmission. In one advantageous embodiment the first block is encoded using 4 parity symbols, whereby the first transmission block comprises 12 symbols in total, i.e. 8 data symbols and 4 parity symbols, which allows the correction of 2 erroneously received symbols. In a further advantageous embodiment of the invention, the second block is encoded for transmission using 6 parity symbols, if the block is shorter than 32 symbols, and using 8 parity symbols, if the block is equal to or longer than 32 symbols. In a still further advantageous embodiment of the invention, the further blocks are encoded using 8 parity symbols. The number of parity symbols used in the Reed-Solomon coding may be different in different embodiments of the invention. It is only necessary that both the transmitter and the receiver know the number of parity symbols used to allow correct reception of a transmission block and error detection and correction according to the Reed-Solomon method.

C. A Third Group of Advantageous Embodiments of the Invention

In a further advantageous embodiment of the invention, information indicating a coding method or a parameter of a coding method for decoding of subsequent transmission blocks is transmitted in the first transmission blocks. For example, in the case of Reed-Solomon coding, the number of parity symbols used in decoding of subsequent blocks can be transmitted. As another example, an identifier of a set of rules for determining the number of parity symbols can be transmitted in the first block.

In an advantageous embodiment of the invention, one bit of the length indication symbols is used for identifying the amount of parity symbols used in Reed-Solomon decoding of subsequent blocks. In this exemplary embodiment, the symbols have light bits, and the length is indicated using a length indication field of two symbols of whose bits one is used for the identification of the amount of parity symbols, which leaves 15 bits for the length indication itself. In this exemplary embodiment, if the identification bit is '0', all blocks are encoded using 4 parity symbols. If the identification bit is '1', the subsequent blocks are encoded using 8 parity symbols. Said identification bit can be for example the first bit of the first symbol of the length indication field. In such an embodiment, the transmitter can select between two coding grades, i.e. a weaker coding having less overhead and a stronger coding having more overhead, according to current radio interface conditions.

In a further advantageous embodiment of the invention, the coding method indication comprises more bits than one bit, for example one symbol. In such an embodiment, there can be more than one coding grade options allowing the transmitter finer control over the transmission process.

D. A Fourth Group of Advantageous Embodiments of the Invention

The invention can be applied especially well in point to multipoint (PMP) microwave radio link systems. In the following, one such an embodiment is described to illustrate one possible use of the invention.

In the PMP system, multiple terminals communicate with an access point. In this embodiment, the inventive method is used for transmission of broadcast messages from the access point to the terminals. According to the embodiment, the terminals are grouped into two groups. A first group of the two groups is arranged to listen during a first half of a time period and a second group of the two groups is arranged to listen during the second half of the time period. The broadcast messages are sent twice i.e. once during said first half of the time period and once during said second half of the time period, whereby all terminals are able to receive the broadcast messages, and half of the terminals are able to transit at the time when the other half is receiving a broadcast message.

The broadcast messages transmitted by the access point comprise various control information, such as for example the identifier of the access point, identifier of the network operator, and identifier of the transmission sector. The broadcast messages may also comprise other types of information such as information about an access time slot, during which new terminals may initiate communication with the access point. The broadcast messages also indicate the reception periods of individual terminals. Consequently, the two broadcast messages have some parts in common, while terminal-specific parts are naturally different in the two broadcast messages of a frame. Also, the broadcast messages may vary in length from frame to frame.

Typically, the access point specifies the transmission periods allocated for a terminal in an individual transmission to the terminal along with other terminal specific control information and possibly payload data. A terminal does not need to receive during other times as the broadcast message times and reception times indicated by the AP. During the other times, a terminal may transmit if transmission is allowed by the AP, or the terminal may be in idle mode in order to save power.

Since the length broadcast messages vary, the inventive transmission method is used for transmission of the broadcast messages from the access point to the terminal. In addition to allowing the variable length of the message, the inventive method allows the message to have an arbitrary length without lengthening of the time required for decoding of the received message, since the decoding is performed in pieces. The whole message is ready and error corrected quickly after reception of the last transmission block, i.e. after the time required to decode and correct the last transmission block. In the case of a long message, the time is much shorter than in the case, that the long message would have been sent in one block.

E. A Fifth Group of Advantageous Embodiments of the Invention

According to an advantageous embodiment of the invention a method for transmission of a sequence of data is provided. In the method, the sequence of data is transmitted in more than one block, the first transmitted block has a predetermined length, and the first transmitted block comprises information indicating the length of the sequence of data.

According to a further advantageous embodiment of the invention, the length S of the part of the sequence of data encoded in the second transmission block is $$S = (LENGTH - M) \bmod N$$

Where M is the length of the part of the sequence of data transmitted in the first block N is a predetermined integer constant, LENGTH is the length of the sequence of data, and MOD is the modulo function.

According to a further advantageous embodiment of the invention, the method further comprises a step, in which at least one transmission block of a third type is transmitted.

According to a further advantageous embodiment of the invention, the number F of said transmission blocks of said third type is calculated by $$F = INT((LENGTH - M)/N)$$

Where LENGTH is the length of the sequence of data to be transmitted, M is the length of the part of the sequence of data transmitted in the first block, N is a predetermined integer constant specifying the length of a part of the sequence of data transmitted in a transmission block of said third type, and INT is a function returning the integer part of its argument.

According to a further advantageous embodiment of the invention, the first transmitted block further comprises information about a parameter of encoding of the subsequent blocks.

According to a further advantageous embodiment of the invention, the method is used in a microwave radio link system.

F. A Sixth Group of Advantageous Embodiments of the Invention

Figure 3:
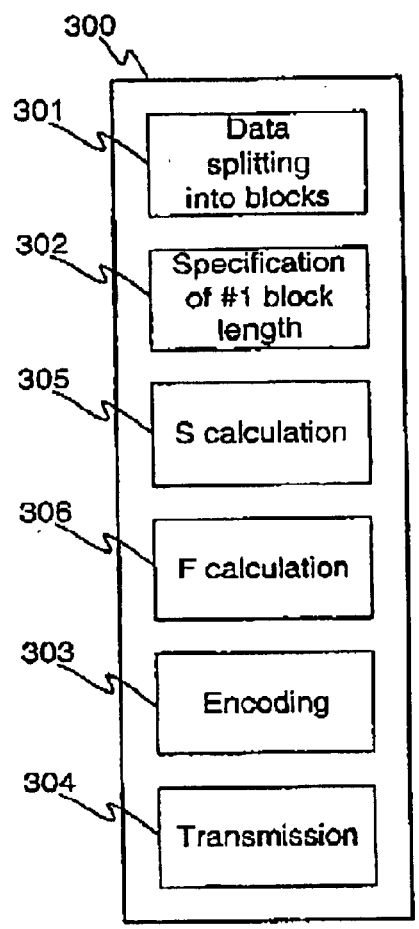
FIG. 3 illustrates a transmitter according to an advantageous embodiment of the invention.

According to a further advantageous embodiment of the invention, a transmitter 300 of a microwave radio link system is provided. FIG. 3 illustrates said transmitter 300. According to the embodiment, the transmitter 300 comprises at least means 301 for splitting a sequence of data to be transmitted into at least two blocks, a first block of said at least two blocks having a predetermined size, means 302 for specifying the length of said sequence in said first block, means 303 for encoding said blocks for transmission, and means 304 for transmitting said blocks, said first block first.

According to a further advantageous embodiment of the invention, the transmitter 300 further comprises means 305 for calculating the length S of the part of the sequence of data encoded in the second transmission block as $$S=(LENGTH-M) \text{ MOD } N$$

where M is the predetermined length of the part of the sequence of data transmitted in the first block, N is a predetermined integer constant, LENGTH is the length of the sequence of data, and MOD is the modulo function.

According to a further advantageous embodiment of the invention, said means for splitting is arranged to split said sequence of data into a first block, a second block and at least one third block if said sequence of data is longer than the sum of two predetermined lengths, the two predetermined lengths being the length of the part of the sequence of data transmitted in the first block and the length of a part of the sequence of data transmitted in a third block.

According to a further advantageous embodiment of the invention, the transmitter 300 further comprises means 306 for calculating the number F of said third transmission blocks as $$F=INT((LENGTH-M)/N)$$

where LENGTH is the length of the sequence of data to be transmitted, M is the length of the part of the sequence of data transmitted in the first block, N is a predetermined integer constant specifying the length of the part of the sequence of data transmitted in a transmission block of said third type, and INT is a function returning the integer part of its argument.

Figure 4:
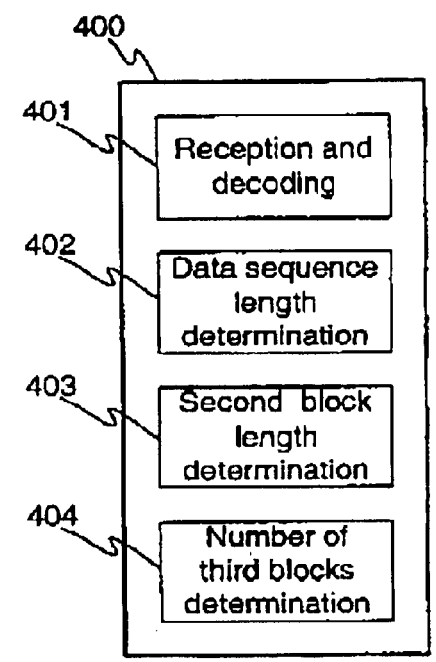
FIG. 4 illustrates a receiver according to an advantageous embodiment of the invention.

According to a still further advantageous embodiment of the invention, a receiver 400 of a microwave radio link system is provided. FIG. 4 illustrates the receiver 400. According to the embodiment, the receiver 400 comprises means 401 for receiving and decoding a first transmission block comprising a part of a data sequence to be received, means 402 for determining the length of said data sequence on the basis of information in said first transmission block, and means 403 for determining the length of a second transmission block to be received at least partly on the basis of said length of said data sequence, and means 404 for determining the number of at least third transmission blocks to be received, if any.

According to a further advantageous embodiment of the invention, an access point 21 of a microwave radio link system is provided. According to the embodiment, the access point comprises a transmitter 300 according to any of the previous paragraphs describing a transmitter. According to a still further advantageous embodiment of the invention, the access point further comprises a receiver 400 according to any of the previous paragraphs describing a receiver.

According to a still further advantageous embodiment of the invention, a terminal 11 of a microwave radio link system is provided. According to the embodiment, the terminal comprises a receiver 400 according to any of the previous paragraphs describing a receiver. According to an even further advantageous embodiment of the invention, the terminal further comprises a transmitter 300 according to any of the previous paragraphs describing a transmitter.

Figure 5:
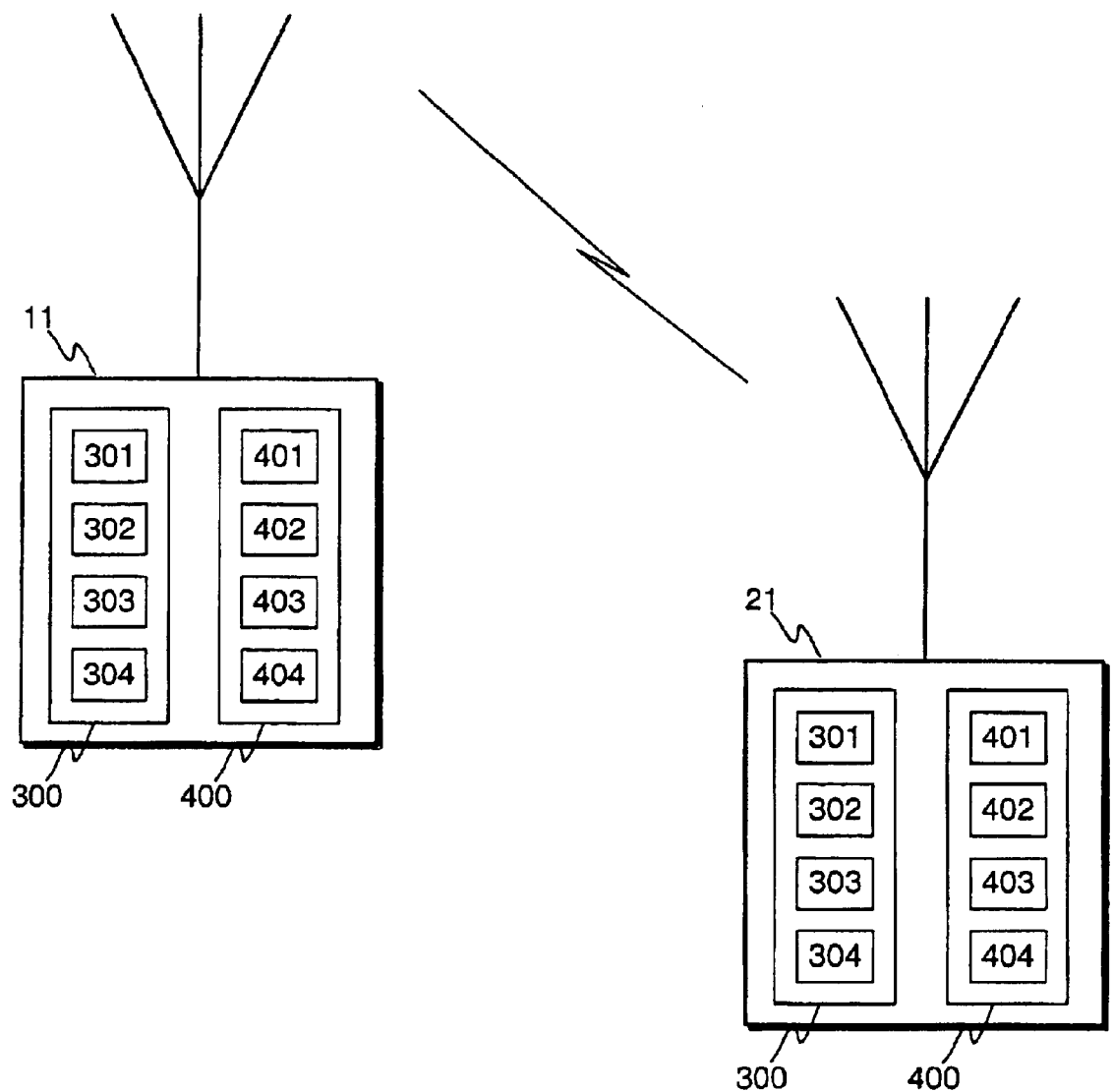
FIG. 5 illustrates an access point and a terminal of a microwave radio link system according to an advantageous embodiment of the invention.

FIG. 5 illustrates an access point 21 and a terminal 11 of a microwave radio link system according to an advantageous embodiment of the invention.

G. Further Considerations

The invention has several advantages. For example, the invention allows the coding and decoding of variable length sequences of data with decoding methods, which require the knowledge of the length of the coded sequence in order to decode it. Further, padding is not needed which saves the precious capacity of the air interface, except in those cases when the data sequence to be transmitted is extremely short. The invention also allows decoding of parts of a long sequence being received, since the decoding is performed in pieces which are separately encoded. The invention is also able to reduce time between the reception of the last symbols of a data sequence and obtaining the whole decoded sequence, since the decoding is performed in pieces, and most of the sequence is already decoded when the last symbols are received and the decoding of the last piece commences. Further, the decoding unit does not need to be capable of decoding a long message, which simplifies the circuit structure of the unit.

In view of the foregoing description it will be evident to a person skilled in the art that various modifications may be made within the scope of the invention. While a preferred embodiment of the invention has been described in detail, it should be apparent that many modifications and variations thereto are possible, all of which fall within the true spirit and scope of the invention.

What is claimed is:

1. A method for transmission of an arbitrarily sized sequence of data, wherein the arbitrarily sized sequence of data is transmitted in more than one block, comprising the steps of:

transmitting a first transmission block comprising a first data portion from the arbitrarily sized sequence of data, said first data portion having a first predetermined length M; and transmitting a second transmission block comprising a second data portion of the arbitrarily sized sequence of data, said second data portion having a variable length S less than a second predetermined length N;

wherein the first transmission block comprises a field in which a total length of the arbitrarily sized sequence of data is indicated.

2. The method according to claim 1, wherein the length S of the second data portion encoded in the second transmission block is:

$$S=(LENGTH-M) \text{ MOD } N$$

wherein LENGTH is the total length of the arbitrarily sized sequence of data, and MOD is the modulo function.

3. The method according to claim 1, further comprising the step of;

transmitting at last one third transmission block, wherein N is a length of portion of data in said at least one third transmission block.

4. The method according to claim 3, a number F of said at least one third transmission block is calculated by:

$$F=INT((LENGTH-M)/N)$$

wherein LENGTH is the total length of the sequence of data to be transmitted, and INT is a function returning the integer part of its argument.

5. The method according to claim 1, wherein the first transmitted block field comprises a field containing a parameter of encoding of the subsequent blocks.

6. The method according to claim 1, wherein the method is used in a microwave radio system.

7. The method according to claim 1, wherein the first transmission block has a predetermined length $L_1$.

8. A transmitter of a microwave radio link system, comprising:
means for splitting an arbitrarily sized sequence of data to be transmitted into at least two portions, a first portion of said at least two portions having a predetermined size M, a second portion of said at least two portions having a variable length S which is less than a second predetermined length N;
means for indicating a total length of said arbitrarily sized sequence, wherein said indication is appended to said first portion and both are transmitted in a first block, and wherein said second portion is transmitted in a second block;
means for encoding said blocks for transmission; and
means for transmitting said blocks, said first block first.

9. The transmitter according to claim 8, further comprising:
means for calculating the length S of the second portion of the arbitrarily sized sequence of data, wherein the second portion is encoded in a second transmission block, as $$S = (\text{LENGTH} - M) \text{ MOD } N$$

where LENGTH is the total length of the sequence of data, and MOD is the modulo function.

10. The transmitter according to claim 8, wherein said means for splitting is arranged to split said arbitrarily sized sequence of data into a first portion, a second portion, and at least one third portion if said arbitrarily sized sequence of data is longer than the sum of the first and second predetermined lengths (N+M), and wherein a length of each of said at least one third portion is N.

11. The transmitter according to claim 10, further comprising:
means for calculating a number F of said third transmission blocks as $$F = \text{INT}((\text{LENGTH} - M)/N)$$

where LENGTH is the length of the sequence of data to be transmitted, and INT is a function returning the integer part of its argument.

12. A receiver of a microwave radio link system, comprising:
means for receiving and decoding a first transmission block comprising a first portion of an arbitrarily sized data sequence to be received;
means for determining a total length of said arbitrarily sized data sequence on the basis of information in said first transmission block;
means for determining a variable length S of a second transmission block to be received at least partly on the basis of said determined total length of said arbitrarily size data sequence; and
means for determining a number F of one or more third transmission blocks to be received, if any.

13. An access point of a microwave radio link system, comprising:
a transmitter comprising:
means for splitting an arbitrarily sized sequence of data to be transmitted into at least two portions, a first portion of said at least two portions having a predetermined size M, a second portion of said at least two portions having a length S which is less than a second predetermined length N;
means for indicating a total length of said arbitrary sized sequence, wherein said indication is appended to said first portion and both are transmitted in a first block, and wherein said second portion is transmitted in a second block;
means for encoding said blocks for transmission; and
means for transmitting said blocks, said first block first.

14. The access point according to claim 13, further comprising:
a receiver comprising:
means for receiving and decoding a first transmission block comprising a first portion of an arbitrarily sized data sequence to be received;
means for determining a total length of said arbitrarily sized data sequence on the basis of information in said first transmission block;
means for determining a length S of a second transmission block to be received at least partly on the basis of said determined total length of said arbitrarily sized data sequence; and
means for determining a number F of one or more third transmission blocks to be received, if any.

15. A terminal of a microwave radio link system, comprising:
a receiver comprising:
means for receiving and decoding a first transmission block comprising a first portion of an arbitrarily sized data sequence to be received;
means for determining a total length of said arbitrarily sized data sequence on the basis of information in said first transmission block;
means for determining a length S of a second transmission block to be received at least partly on the basis of said determined total length of said arbitrarily sized data sequence; and
means for determining a number F of one or more third transmission blocks to be received, if any.

16. The terminal according to claim 15, further comprising:
a transmitter comprising:
means for splitting an arbitrarily sized sequence of data to be transmitted into at least two portions, a first portion of said at least two portions having a predetermined size M, a second portion of said at least two portions having a length S which is less than a second predetermined length N;
means for indicating a total length of said arbitrarily sized sequence, wherein said indication is appended to said first portion and both are transmitted in a first block, and wherein said second portion is transmitted in a second block;
means for encoding said blocks for transmission; and
means for transmitting said blocks, said first block first.

17. A method for transmitting an arbitrarily sized sequence of data over an air interface in a cellular telecommunications system, comprising the steps of:
transmitting a first transmission block with a first data portion of a first predetermined length M from the arbitrarily sized sequence of data, and a field indicating a total length T of the arbitrarily sized sequence of data;

if the total length T of the arbitrarily sized sequence of data is greater than M, transmitting a second transmission block with a second data portion of variable length S from the arbitrarily sized sequence of data, wherein S is less than a second predetermined length N; and if the total length T is greater than the sum of M and the second predetermined length N, transmitting one or more third transmission blocks, each third transmission block having a data portion of length N from the arbitrarily sized sequence of data;

whereby a receiver of the arbitrarily sized sequence of data may determine a number and size of all transmission blocks, if any, after the first transmission block from the field indicating length T in the fat transmission block.

18. The method according to claim 17, comprising the step of:

calculating the length S of the second transmission block using the formula:

$$S=(T-M) \text{ MOD } N$$

wherein MOD is the modulo function.

19. The method according to claim 17, further comprising the step of:

calculating a number F of one or more third transmission blocks using the formula:

$$F=INT((T-M)/N)$$

where INT is a function returning the integer part of its argument.

20. The method according to claim 17, wherein the method is used for transmission of broadcast messages from an access point to an access terminal in the cellular telecommunications system.

21. The method according to claim 20, wherein the access terminal is a fixed substation in the cellular telecommunications system.

22. The method according to claim 20, wherein the access point and the access terminal comprise a HIPERACCESS or HIPERLAN system.

23. The method according to claim 17, wherein the method is used for transmission of broadcast messages from a single point to many points (PMP) in the cellular telecommunications system.

24. The method according to claim 17, wherein the method is used for transmission of microwave radio broadcast messages in the cellular telecommunications system.

25. The method according to claim 17, wherein a value for the predetermined length M is selected to be not much larger than a length of sore frequently repeating short message.

26. The method according to claim 17, further comprising the step of:

applying error correction coding to the data portions of the transmission blocks.

27. The method according to claim 26, further comprising the step of:

placing an indication of a type of error correction coding used in each of the transmission blocks.

28. The method according to claim 26, wherein the step of applying error correction coding to the data portions of the transmission blocks comprises the steps of:

calculating, for each transmission block, at least one parity symbol from the data portion of the transmission block;

placing the calculated at least one parity symbol in the transmission block.

29. The method according to claim 28, wherein a determined number of at least one parity symbol is used on the data portions in the one or more third transmission blocks, the method further comprising the step of:

placing an indication of said determined number in the first transmission block.

30. The method according to claim 17, further comprising the step of:

if T is less than M, padding the arbitrarily sized sequence of data in order that its length equals M, and using the padded sequence as the first data portion in the first, and only, transmission block.

31. The method according to claim 17, wherein the step of, if the total length T is greater than M, transmitting a second transmission block with a second data portion of variable length S from the arbitrarily sized sequence of data, comprises the steps of determining a length R of a remaining portion of the arbitrary sized sequence of data without the first data portion of length M;

if R is less than N, using the remaining portion of the arbitrarily sized sequence of data as the second data portion of the second, and last, transmission block; and if R is greater than N, using a portion of length S from the remaining portion of the arbitrarily sized sequence of data as the second data portion for the second transmission block, wherein S equals a remainder portion of the remaining portion after subtracting a largest multiple of N therefrom, and using one or more portions, each of length N, from the remaining portion without the second portion of length S of the arbitrarily sized sequence of data as the one or more third data portions of the one or more third transmission blocks.

32. The method according to claim 17, wherein the first transmission block has a predetermined length $L_1$.

* * * * *